United States Patent
Ring et al.

(10) Patent No.: US 8,624,302 B2
(45) Date of Patent: Jan. 7, 2014

(54) STRUCTURE AND METHOD FOR POST OXIDATION SILICON TRENCH BOTTOM SHAPING

(75) Inventors: Matthew A. Ring, Saco, ME (US); Henry G. Prosack, Jr., Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 91 days.

(21) Appl. No.: 13/015,448

(22) Filed: Jan. 27, 2011

(65) Prior Publication Data

US 2011/0193142 A1    Aug. 11, 2011

Related U.S. Application Data

(60) Provisional application No. 61/302,057, filed on Feb. 5, 2010.

(51) Int. Cl.
*H01L 27/06*    (2006.01)

(52) U.S. Cl.
USPC ............ 257/272; 257/E21.008; 257/E27.092; 257/E27.093

(58) Field of Classification Search
USPC .................. 257/E21.008, E27.011, E29.256, 257/E27.016, E27.092, E21.545, E29.02, 257/343, 272, 339, 342, 506; 438/386, 423
See application file for complete search history.

(56) References Cited

U.S. PATENT DOCUMENTS

| | | |
|---|---|---|
| 5,075,739 A | 12/1991 | Davies |
| 5,111,254 A | 5/1992 | Levinson et al. |
| 5,204,545 A | 4/1993 | Terashima |
| 5,334,546 A | 8/1994 | Terashima |
| 5,872,038 A | 2/1999 | Duane et al. |
| 6,037,632 A | 3/2000 | Omura et al. |
| 6,110,804 A | 8/2000 | Parthasarathy et al. |
| 6,190,948 B1 | 2/2001 | Seok |
| 6,310,378 B1 | 10/2001 | Letavic et al. |

(Continued)

FOREIGN PATENT DOCUMENTS

| | | |
|---|---|---|
| EP | 20164 A1 | 12/1990 |
| JP | 62-173764 A | 7/1987 |

(Continued)

OTHER PUBLICATIONS

Chen et al. "Optimization of the specific on-resistance of the COOLMOSTM, "IEEE Transactions on Electron Devices 48:344-348 (Feb. 2001).

*Primary Examiner* — Stephen W Smoot
*Assistant Examiner* — Edward Chin (57) ABSTRACT

A method of fabricating an LFCC device includes forming a first trench in a substrate that extends vertically from an upper surface to a depth within the substrate, the first trench having first sidewalls, a first bottom, and a pattern formed on the first sidewalls near the first bottom of the trench, and forming an oxide layer on the first sidewalls and first bottom of the first trench that leaves a second trench located within the first trench and is separated from the first trench by the oxide layer. The second trench has second sidewalls that are substantially vertical without showing the pattern and a second bottom that is substantially flat. The pattern compensates for the difference in oxidation rates between the bottom of the first trench and the first sidewalls. The LFCC structure includes a first trench with the pattern.

18 Claims, 7 Drawing Sheets

(56) References Cited

U.S. PATENT DOCUMENTS

| | | |
|---|---|---|
| 6,323,104 B1 | 11/2001 | Trivedi |
| 6,353,252 B1 | 3/2002 | Yasuhara et al. |
| 6,355,966 B1 | 3/2002 | Trivedi |
| 6,576,973 B2 | 6/2003 | Collard et al. |
| 6,590,240 B1 | 7/2003 | Lanois |
| 6,717,230 B2 | 4/2004 | Kocon |
| 6,750,506 B2 | 6/2004 | Noda et al. |
| 6,873,011 B1 | 3/2005 | Huang et al. |
| 6,879,005 B2 | 4/2005 | Yamaguchi et al. |
| 6,897,133 B2 | 5/2005 | Collard |
| 6,903,413 B2 | 6/2005 | Lanois |
| 6,903,421 B1 | 6/2005 | Huang et al. |
| 6,939,805 B2 | 9/2005 | Lutzen et al. |
| 6,989,566 B2 | 1/2006 | Noda et al. |
| 6,995,428 B2 | 2/2006 | Huang et al. |
| 7,033,891 B2 | 4/2006 | Wilson et al. |
| 7,078,783 B2 | 7/2006 | Lanois |
| 7,101,739 B2 | 9/2006 | Lanois |
| 7,208,385 B2 | 4/2007 | Hossain et al. |
| 7,224,038 B2 | 5/2007 | Usui et al. |
| 7,282,765 B2 | 10/2007 | Xu et al. |
| 7,535,057 B2 | 5/2009 | Yang |
| 8,193,565 B2 * | 6/2012 | Yang et al. .................. 257/272 |
| 2002/0105007 A1 | 8/2002 | Saggio et al. |
| 2002/0130358 A1 | 9/2002 | Van Dalen et al. |
| 2003/0232477 A1 | 12/2003 | Deboy et al. |
| 2004/0164304 A1 | 8/2004 | Magri et al. |
| 2005/0127434 A1 | 6/2005 | Quoirin et al. |
| 2005/0133858 A1 | 6/2005 | Banejee et al. |
| 2005/0136613 A1 | 6/2005 | Poveda |
| 2006/0118833 A1 | 6/2006 | Lanais |
| 2006/0138450 A1 | 6/2006 | Lanois et al. |
| 2006/0157745 A1 | 7/2006 | Lanois |
| 2006/0205196 A1 | 9/2006 | Lanois |
| 2006/0255401 A1 | 11/2006 | Yang et al. |
| 2006/0267044 A1 | 11/2006 | Yang |
| 2007/0052060 A1 | 3/2007 | Yang |
| 2007/0102725 A1 | 5/2007 | Magri' et al. |
| 2007/0176229 A1 * | 8/2007 | Willmeroth et al. .......... 257/328 |
| 2007/0187781 A1 | 8/2007 | Kocon |
| 2007/0262398 A1 * | 11/2007 | Darwish et al. ............... 257/409 |
| 2008/0257409 A1 * | 10/2008 | Li et al. ........................ 136/259 |
| 2010/0244183 A1 * | 9/2010 | Aoki et al. .................... 257/506 |
| 2012/0091516 A1 * | 4/2012 | Yang et al. .................... 257/296 |

FOREIGN PATENT DOCUMENTS

| | | | |
|---|---|---|---|
| JP | 63-296282 | A | 12/1988 |
| JP | 2002-299622 | A | 10/2002 |
| WO | WO01/59846 | A1 | 8/2001 |

* cited by examiner

STRUCTURE AND METHOD FOR POST OXIDATION SILICON TRENCH BOTTOM SHAPING

CROSS-REFERENCE TO RELATED APPLICATIONS

This application claims the benefit of U.S. Provisional Application No. 61/302,057, filed Feb. 5, 2010, which is incorporated by reference in its entirety for all purposes.

BACKGROUND

In semiconductor devices, including high voltage devices, it is desirable to obtain a low on-resistance that is primarily determined by the drift region resistance. Typically, the drift region resistance of a transistor is lowered by increasing the doping level of the drift region. However, increasing the doping level of the drift region has the undesirable effect of reducing the breakdown voltage. The doping level of the drift region is therefore optimized to obtain the maximum on-resistance while still maintaining a sufficiently high breakdown voltage. As the requirements for breakdown voltages increase, the use of drift region doping concentrations to adjust on-resistance and breakdown voltages becomes more difficult.

In addition to breakdown voltages being affected by the doping concentration of the drift region, breakdown voltages are also affected by the electric field distribution inside and outside the device. As a result, there have been efforts in the art to control the electric field distribution by field-shaping methods and therefore control the on-resistance and breakdown voltage of transistor devices. For example, lateral floating coupled capacitor (FCC) structures have been used to control the electric fields in the drift region of a transistor and thereby improve on-resistance. These FCC structures include insulated trenches formed in the drift region of a transistor, which contain isolated electrodes and are parallel to the direction of current flow. These FCC structures improve transistor properties. For example, the drift region field-shaping provided by the FCC regions can desirably provide high breakdown voltage and low on-resistance simultaneously. However, there are problems associated with fabricating and using floating coupled capacitors to control the breakdown voltage and on-resistance including relying on fabrication methods that use highly doped polysilicon to fill trenches, which requires additional polysilicon deposition steps that make the process more expensive and reduces yields. Further, FCC structures made by filling trenches with highly doped polysilicon can result in FCC structures that have voids. These voids can be detrimental to an FCC device.

Therefore, there is need for FCC structures that are fabricated more efficiently and which have few or substantially no voids in the FCC.

BRIEF SUMMARY

Embodiments of the present invention allow for easier and more reliable fabrication methods for making stable lateral floating coupled capacitors (LFCC) devices, which can be integrated with existing fabrication processes. Embodiments of the present invention also provide LFCC field effect transistors, which reduce on-resistance while maintaining higher breakdown voltages. Embodiments of the present invention further provide methods of fabricating LFCC field effect transistors.

According to an embodiment, a method includes forming a first trench in a substrate that extends vertically from an upper surface to a depth within the substrate, the first trench having first sidewalls, a first bottom, and a pattern formed on the first sidewalls near the first bottom of the trench, and forming an oxide layer on the first sidewalls and first bottom of the first trench that leaves a second trench located within the first trench and is separated from the first trench by the oxide layer. The second trench has second sidewalls that are substantially vertical without showing the pattern and a second bottom that is substantially flat. The pattern compensates for the difference in oxidation rates between the bottom of the first trench and the first sidewalls.

In another embodiment, forming the pattern includes forming a notch shape.

In yet another embodiment, the substrate is silicon, and forming the first trench creates a (111) silicon crystallographic plane along the first bottom of the first trench, forming a (110) silicon crystallographic plane along the first sidewalls of the first trench, and forming silicon crystallographic planes along the pattern that compensate for the difference in oxidation rates between the (111) silicon crystallographic planes and the (110) silicon crystallographic planes.

In yet another embodiment, the method further includes etching the substrate for a first time period with a first gas mixture, which has a first ratio of reactant gas to passivant gas, to form the first sidewalls. The first ratio of reactant gas to passivant gas is then changed to a second ratio of reactant gas to passivant gas. The substrate is then etched for a second time period with a second gas mixture, which has a second ratio of reactant gas to passivant gas, to form the pattern. The reactant gas can be SF6 and the passivant gas can be O2, the second ratio of reactant gas to passivant gas can be (1.1:1), and the second time period can range between 15 and 25 seconds. In one embodiment the second time period is 20 seconds.

In yet another embodiment, the method further includes decreasing the ratio of reactive gas to passivant gas so that the second ratio of reactive gas to passivant gas is less than the first ratio of reactive gas to passivant gas.

In yet another embodiment, the method further includes changing the flow of the gas mixture so that the flow of the second gas mixture is different than the flow of the first gas mixture.

In yet another embodiment, the method further includes decreasing the flow of the gas mixture so that the flow of the second gas mixture is less than the flow of the first gas mixture.

In yet another embodiment, the method further includes changing the pressure of the gas mixture so that the pressure of the second gas mixture is different than the pressure of the first gas mixture.

In yet another embodiment, the method further includes increasing the pressure of the gas mixture so that the pressure of the second gas mixture is higher than the pressure of the first gas mixture.

In yet another embodiment, the method further includes changing the flow of a neutral gas. The flow of neutral gas, which can be an inert gas such as argon, helium, xenon, etc, can be changed either by itself or in combination with changes made to the gas mixture.

In yet another embodiment, forming the first trench with the pattern further includes etching the substrate with a process that modulates an etchant process time to passivant process time and/or modulates an etchant gas composition to passivant gas composition.

In yet another embodiment, forming the first trench with the pattern further includes etching the substrate using a Time Division Multiplexing (TDM) etch process.

In yet another embodiment, forming the first trench with the pattern further includes etching the substrate using a combination of etch stop layers and etching steps.

In yet another embodiment, forming the first trench with the pattern further includes etching the substrate using a varied clamp pressures and/or varied substrate temperatures to produce the desired shape in the silicon.

In another embodiment, a method of fabricating a semiconductor device includes forming a first trench in a silicon substrate that extends vertically from an upper surface to a depth within the substrate. The first trench, which has first sidewalls, a first bottom, and a pattern formed on the first sidewalls near the first bottom of the trench, is formed by first etching the silicon substrate for a first time period with a first gas mixture to form the first sidewalls. The first gas mixture has a first ratio of reactant gas to passivant gas, a first flow, and first pressure. After the first time period has lapsed, a second gas mixtures having a second ratio of reactive gas to passivant gas that is less than the first ratio of reactive gas to passivant gas, a second flow that is less than the first flow, and a second pressure that is higher than the first pressure is formed. The silicon substrate is then etched for a second time period with the second gas mixture to form the pattern. An oxide layer is then formed on the first sidewalls, first bottom and pattern, which can be notched shape, of the first trench that leaves a second trench located within the first trench and separated from the first trench by the oxide layer. The second trench has second sidewalls that are substantially vertical without showing the pattern and a second bottom that is substantially flat. The second trench is then filled with a conductor to form a lateral floating capacitively coupled device. The pattern, which can be a notch shape, compensates for the difference in oxidation rates between the bottom of the first trench and the first sidewalls. The substrate can be silicon. Forming the first trench can create a (111) silicon crystallographic plane along the first bottom of the first trench, a (110) silicon crystallographic plane along the first side walls of the first trench, and silicon crystallographic planes along the pattern that compensate for the difference in oxidation rates between the (111) silicon crystallographic plane and the (110) silicon crystallographic plane.

In another embodiment, a semiconductor device includes a source region, a drain region, a gate region, a drift region disposed between the source region and the drain region which provides a conduction path between the source and the drain, and a floating coupled capacitor formed in a trench region disposed in the drift region between the source regions and the drain region. Each trench includes a first trench that extends vertically from an upper surface to a depth within a silicon substrate. The first trench has first sidewalls, a first bottom, and a pattern formed on the first sidewalls near the first bottom of the trench. An oxide layer is disposed on the first sidewalls, first bottom and pattern of the first trench that leaves a second trench located within the first trench and is separated from the first trench by the oxide layer. The second trench has second sidewalls that are substantially vertical without showing the pattern and a second bottom that is substantially flat. A conductive material is disposed within the second trench to form the floating coupled capacitor. The pattern, which can be a notch shape, compensates for the difference in oxidation rates between the bottom of the first trench and the first sidewalls. The first trench can have a (111) silicon crystallographic plane along the first bottom of the first trench, a (110) silicon crystallographic plane along the first side walls of the first trench, and silicon crystallographic planes along the pattern that compensate for the difference in oxidation rates between the (111) silicon crystallographic planes and the (110) silicon crystallographic planes.

In another embodiment, a semiconductor device includes a source, a drain, a gate, and trench structures. At least one of the trench structures includes a first trench that extends vertically from an upper surface to a depth within a silicon substrate. The first trench has first sidewalls, a first bottom, and a pattern formed on the first sidewalls near the first bottom of the trench. An oxide layer is disposed on the first sidewalls and first bottom of the first trench that leaves a second trench located within the first trench and is separated from the first trench by the oxide layer. The second trench has second sidewalls that are substantially vertical without showing the pattern and a second bottom that is substantially flat. The pattern compensates for the difference in oxidation rates between the bottom of the first trench and the first sidewalls. The at least one trench structure can further include a conductive material disposed within the second trench to form a floating coupled capacitor. The first trench can include a (111) silicon crystallographic plane along the first bottom surface of the first trench, a (111) silicon crystallographic plane along the first side wall surface of the first trench, and at least one silicon crystallographic plane along the pattern surface that compensates for the difference in oxidation rates between the (111) silicon crystallographic plane and the (110) silicon crystallographic plane. The pattern can be a notch shape.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

DETAILED DESCRIPTION

In the following description, for the purposes of explanation, specific details are set forth in order to provide a thorough understanding of the invention. However, it will be apparent that the invention may be practiced without these specific details.

Embodiments allow for easier and more reliable fabrication methods for making stable lateral floating coupled capacitors (LFCC) devices, which can be integrated with existing fabrication processes. Embodiments also provide field effect transistors with lateral floating control capacitors that reduce on-resistance while maintaining higher breakdown voltages. Embodiments further provide methods of fabricating these field effect transistors with lateral floating control capacitors.

In embodiments, the drift region of a field effect transistor includes an active drift region that conducts current between the source region and the drain region when voltage is applied to the gate region and inactive floating charge control (FCC) regions that field-shape the active drift region to improve breakdown voltage. The FCC structures are formed in trench regions disposed in the drift regions between the source regions and the drain region. Each trench, which contains an FCC and extends vertically into a silicon substrate, has first sidewalls, a first bottom, and a pattern formed on the first sidewalls near the first bottom of the trench. An oxide layer disposed on the first sidewalls and first bottom of the first trench that leaves a second trench located within the first trench and is separated from the first trench by the oxide layer. Because of the pattern in the first trench, which can be a notch pattern, the second trench is formed with nominally a flat bottom and nearly vertical sides without re-entrant sidewalls. The pattern compensates for the difference in oxidation rates between the bottom of the first trench and the first sidewalls. A conductive material is disposed within the second trench to form the floating coupled capacitor. The trenches, which contain the FCC regions, can be made so that the trenches in the termination region are either parallel or perpendicular to the trenches in the action region. Details of these embodiments are explained below with reference to the figures.

Further, unlike the prior art, which requires using highly doped polysilicon to fill the trenches and an additional polysilicon deposition, embodiments allow for depositing the gate poly prior to doping. Additionally, using the pattern structure eliminates potential voids, which are detrimental to the FCC device. Embodiments also enable the integration of a trench capacitor of LFCC device into a field oxide layer isolated IC flow without adding additional thermal steps promoting the diffusion of various silicon dopants from a specialized isolation oxide layer on the trench sidewalls.

Figure 1A:
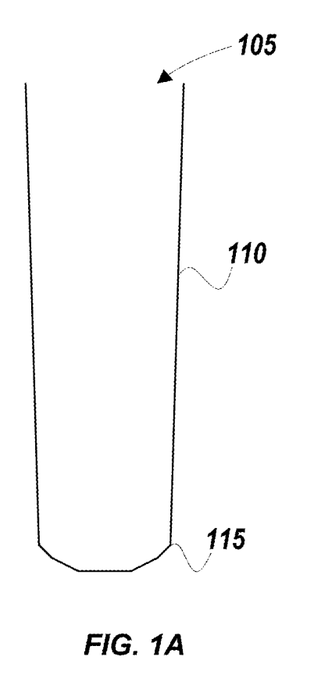
FIG. 1A is an illustration of a trench used in making semiconductor transistors.

FIG. 1A is an illustration of a trench 105 used in making semiconductor transistors. The trench 105 is a trench having substantially vertical sidewalls 110 and a smooth rounded bottom 115 that has a flat portion in the center. When this type of trench 105 is etched into a silicon substrate the vertical sidewalls 110 surfaces and the smooth rounded bottom 115 surfaces have different crystallographic planes. Since oxidation rates of silicon are dependent on the crystallographic plane on which the oxidation is done, having different planes on the sidewalls 110 and the bottom 115 of the trench leads to different oxidation rates on the sidewalls 110 and the bottom 115 of the trench. The different oxidation rates lead to uneven oxidation around the bottom of the trench, as illustrated with reference to FIGS. 1B and 1C.

Figure 1B:
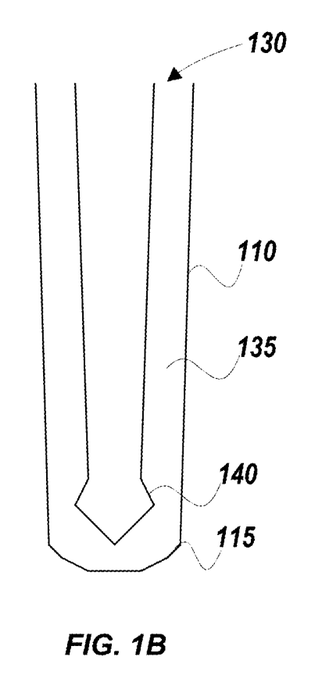
FIG. 1B is an illustration of a trench after oxidation showing a spear-like structure at the bottom of the trench which causes voids.

FIG. 1B illustrates the trench 105 after oxidation 130 showing non-uniform oxidation 135 along the trench sidewalls 110 and bottom 115 of the trench. The non-uniform oxidation causes a spear-like void 140 near the bottom of the trench which is difficult to deposit conductive material into and causes voids in later deposited conductive materials used to form the FCC regions.

Figure 1C:
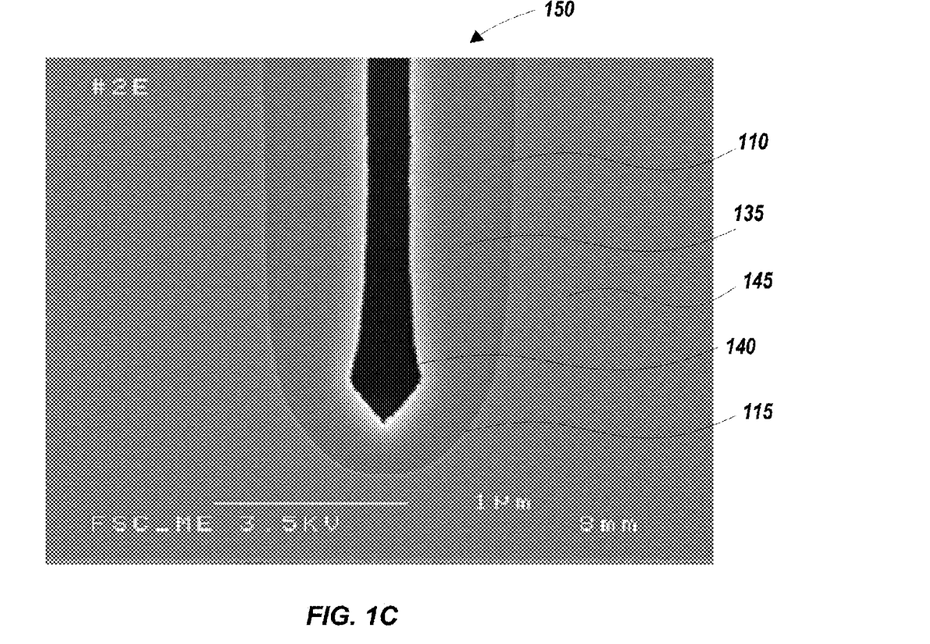
FIG. 1C is a Scanning Electron Microscope (SEM) image of the trench after oxidation showing the spear-like structure at the bottom of the trench which causes voids.

FIG. 1C is an Scanning Electron Microscope (SEM) image 150 of the trench after oxidation showing the spear-like void 140 near the bottom of the trench. As mentioned, this spear like void causes problems in later deposition processes. The spear-like void makes it difficult to deposit conductive material into the second trench created by the oxidation 135 and can results in voids in the conductive material that is later deposited. FIG. 1C shows that the trench with sidewalls 110 and bottom 115 is deposited in a silicon substrate 145. The spear-like void occurs when trenches that are formed in silicon are oxidized. Etching a trench in silicon forms a trench having (111) silicon crystallographic plane along the bottom 115 surface of the first trench and a (110) silicon crystallographic plane along the sidewalls 110 surfaces of the trench. It is these different crystallographic orientations and the fact that the silicon oxidation rate changes depending on the crystallographic structure that cause the void 140 to occur.

Figure 1D:
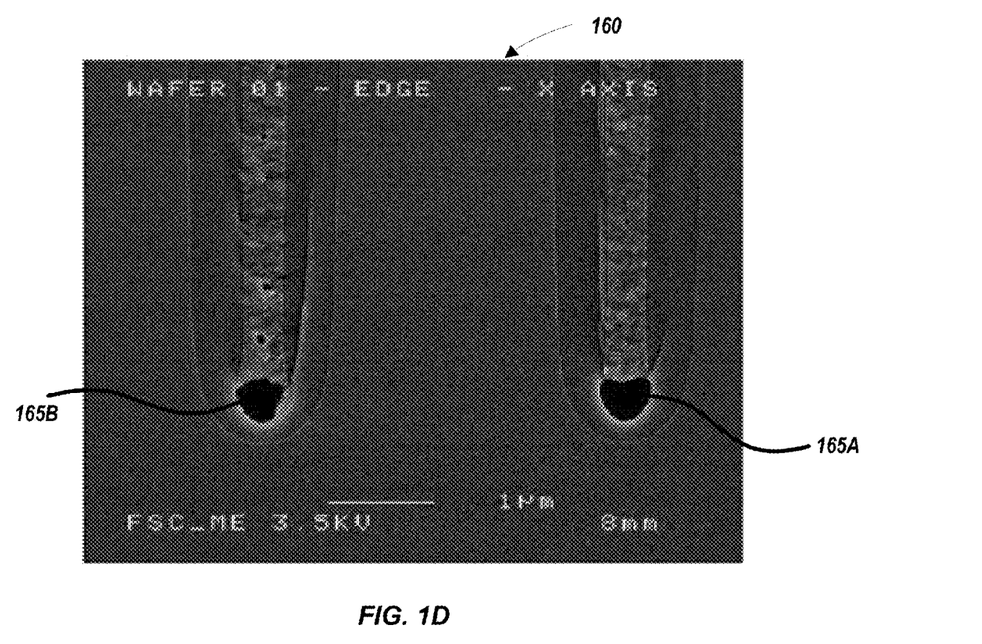
FIG. 1D is an Scanning Electron Microscope (SEM) image of a floating capacitor made using the trench illustrated in FIG. 1A showing voids in the floating capacitor.

FIG. 1D is a Scanning Electron Microscope (SEM) image 160 of a floating capacitor made using the trench illustrated in FIG. 1A showing voids in the floating capacitor. Image 160 shows the second trench created by the oxidation process having the spear-like void 140 filled with conductive material to form the LFCC structure. As can be seen from image 160, the conductive material did not deposit very well into the spear-like region located at the bottom portion of the second trench created by the oxidation process. This void can create defects in the transistor having the LFCC structure which can be detrimental to its performance.

Figure 2A:
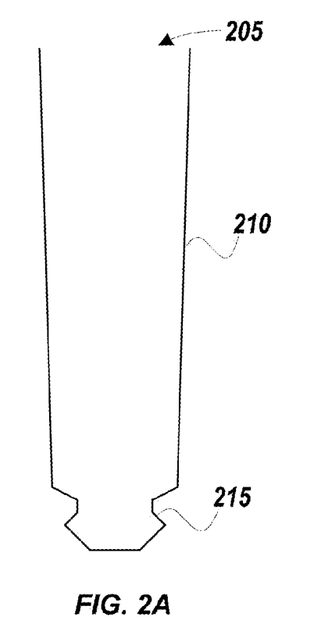
FIG. 2A is an illustration of a trench used to fabricate an LFCC semiconductor transistor structure, in accordance with an embodiment.

FIG. 2A is an illustration of a trench 205 used to fabricate LFCC semiconductor transistor structures, in accordance with an embodiment. Trench 205 has substantially vertical sidewalls 210 and a pattern 215 that can resemble a notch with a flat portion in the center. The pattern 215 is used to compensate for non-uniform oxidation on the trench sidewalls and trench bottom. As described above with reference to FIGS. 1A-1D, etching a trench in a silicon substrate forms sidewalls and a bottom with different crystallographic orientations which causes spear-like oxidation pattern inside the trench when the trench undergoes an oxidation process. When trench 205 is etched into a silicon substrate, the vertical sidewalls 210 surfaces and the pattern 215 surface have different crystallographic planes. The surface of the bottom portion of pattern 215 which looks substantially flat has a (111) silicon crystallographic plane. The surface of the sidewalls 210 of trench 205 have (110) silicon crystallographic plane. The surface of the notched portion of the pattern 215 has crystallographic planes that compensate for the difference in oxidation rates between (111) silicon crystallographic plane and (110) silicon crystallographic plane. Although the pattern 215 is illustrated as a notch, other patterns can also be used to compensate for the difference in oxidation rates between different crystallographic planes.

Figure 2B:
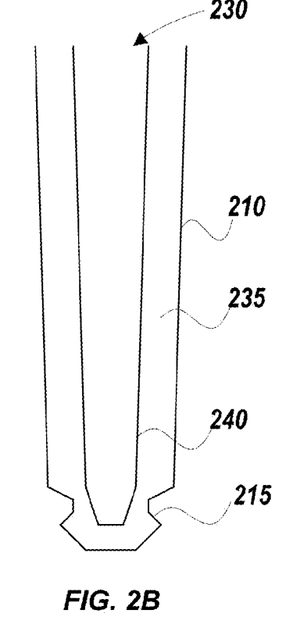
FIG. 2B is an illustration of the trench illustrated in FIG. 2A after oxidation showing nominally a flat bottom with nearly vertical sides without a re-entrant side-walls, which reduces voids.

FIG. 2B is an illustration of a trench 230 after oxidation 235 showing nominally a flat bottom along the notch area 215 with nearly vertical sides 210 without a re-entrant side-walls, which reduces voids. As compared with the oxidation shown in FIGS. 1A-1C, the oxidation 235 is substantially more uniform than the oxidation 135 and lacks the spear-like void 140 near the bottom of the trench. The oxidation 235 creates a second trench 240 within the first trench, which is later filled with conductive material used to form the FCC regions. Since this process creates a second trench 240, which lacks a spear-like void, the conductive material is more easily and more reliably deposited in the second trench. The second trench shape allows the conductive material to be uniformly deposited into the trench without creating voids, as illustrated in FIG. 2C.

Figure 2C:
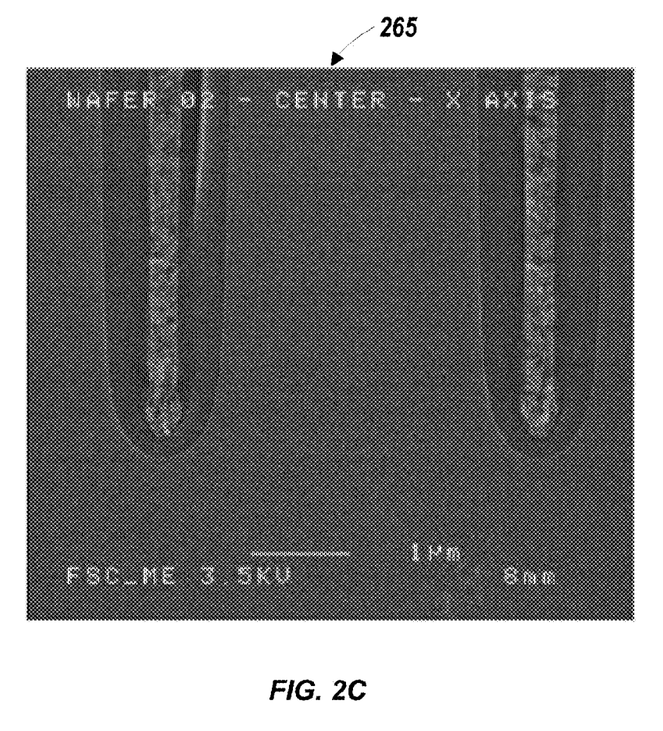
FIG. 2C is a Scanning Electron Microscope (SEM) image of a floating capacitor made using the trench illustrated in FIG. 2A.

FIG. 2C is a Scanning Electron Microscope (SEM) image 265 of a floating capacitor made using the trench illustrated in FIG. 2A showing a floating capacitor without voids. Image 265 shows the second trench created by the oxidation process without any kind of void. The second trench is filled with conductive material to form the LFCC structure. As can be seen from image 265, the conductive material has been substantially uniformly deposited into the second trench created by the oxidation process. Shaping the termination of a silicon trench to have a notched profile with an etch process such as Time Division Multiplexing (TDM), a combination of etch stop layers and etching steps, or varied clamp pressures and/or varied substrate temperatures can be used to produce the desired shape in the silicon.

The image 265 illustrates a trench 230 with a floating capacitor which is part of an LFCC semiconductor device. In one embodiment, the LFCC semiconductor device includes a source region, a drain region, a gate region, a drift region disposed between the source region and the drain region which provides a conduction path between the source and the drain, and a floating coupled capacitors (FCC) formed in a trench region and disposed in the drift region between the source regions and the drain region. Each trench further includes a first trench that extends vertically from an upper surface to a depth within a silicon substrate. The first trench has first sidewalls, a first bottom, and a pattern formed on the first sidewalls near the first bottom of the trench. An oxide layer is disposed on the first sidewalls and first bottom of the first trench that leaves a second trench located within the first trench and is separated from the first trench by the oxide layer. The second trench has second sidewalls that are substantially vertical without showing the pattern and a second bottom that is substantially flat. A conductive material is disposed within the second trench to form the floating coupled capacitor. Since silicon oxidation rates change with exposed silicon lattice face, by adding a pattern with stubs to the bottom of the trench the spear-head is eliminated. The pattern, which can be notched shape, compensates for the difference in oxidation rates between the bottom of the first trench and the first sidewalls. The first trench can also form a (111) silicon crystallographic plane along the first bottom surface of the first trench, a (110) silicon crystallographic plane along the first side wall surfaces of the first trench, and silicon crystallographic planes along the pattern surface that compensate for the difference in oxidation rates between the (111) silicon crystallographic planes and the (110) silicon crystallographic planes.

Using this pattern eliminates the spear-head profile that was described above with reference to FIGS. 1A-1D and therefore reduces voids in the floating capacitors. Further, using deep trench etchers employing TDM technology, the sidewall shapes can be altered by modulating the etchant to passivant step times and gas compositions, creating a pattern or notched bottom profile. By notching the bottom of the deep trenches in silicon, the slower oxidation rate due to the (111) crystallographic plane oxidizes the thicker edges while slower oxidizing crystallographic planes are recessed.

Figure 3:
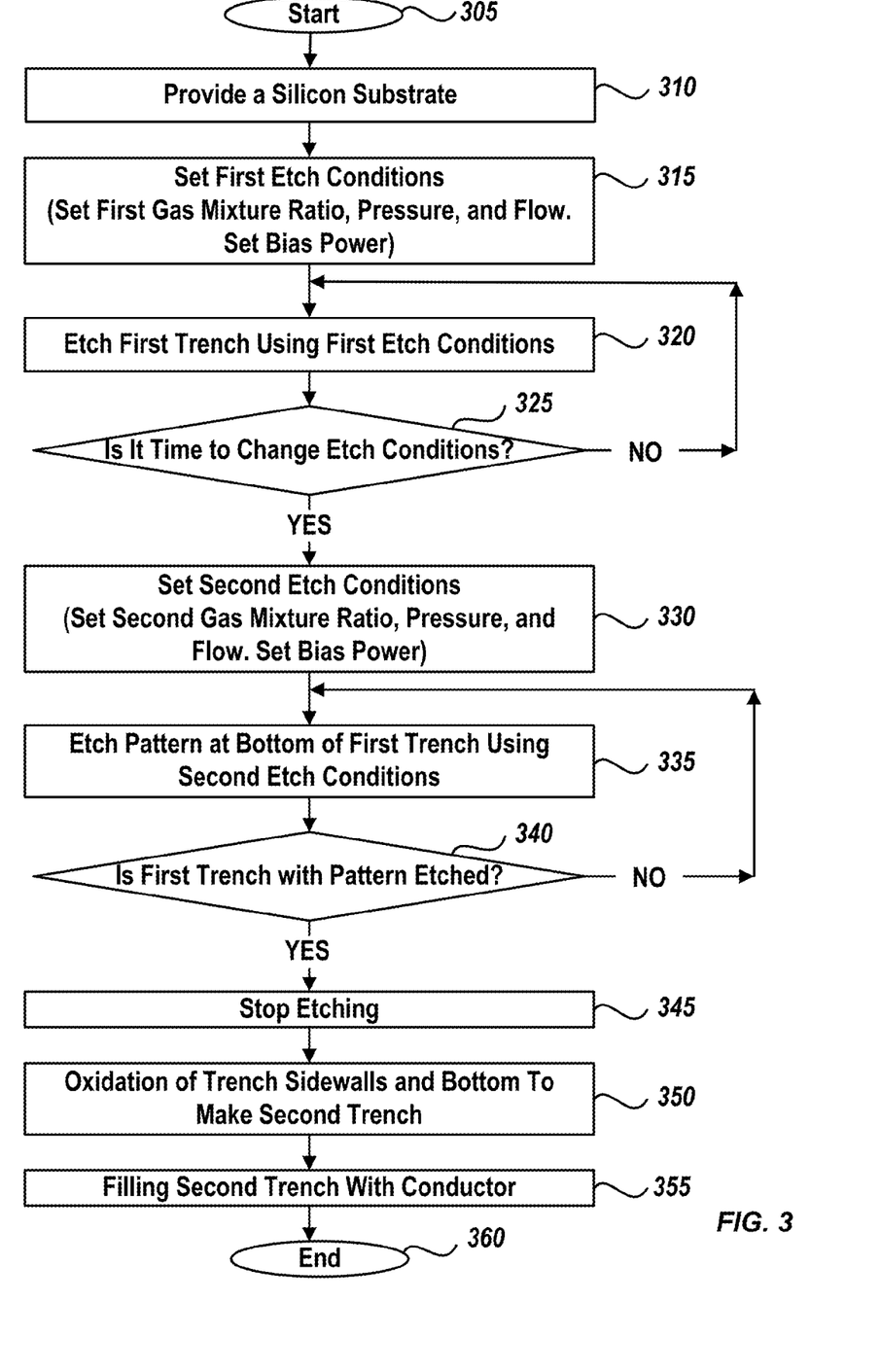
FIG. 3 is a flowchart illustrating a method used to manufacture an LFCC structure using the trench illustrated in FIG. 2A.

FIG. 3 is a flowchart illustrating a method used to manufacture an LFCC structure using the trench illustrated in FIG. 2A, in accordance with an embodiment. The method starts in operation 305 by setting up an etch tool such as a LAM 9400 for etching trenches into substrates. Next in operation 310, a silicon substrate is provided into the etching tool for etching a trench. In operation 315, the first etch conditions for etching predominantly the trench sidewalls 210 are set. Setting the first etch conditions includes setting a first gas mixture ratio, a first pressure, a first gas flow and first bias power. The first gas mixture can include mixtures of $SF_6$, $O_2$, and any neutral diluting material such as helium, argon, xenon or other noble gasses or inert gasses. $SF_6$ is a reactant gas and $O_2$ is a passivant gas. In one embodiment the first ratio of $SF_6$ to $O_2$ is 1.6:1, the first pressure is 55 milliTorr, the first total gas flow is 325 SCCM (standard cubic centimeters per minute), the first bias power is 15 Watts, and the first temperature is set at 7° C. but can range from 2° C. to 12° C.

Once the first etch conditions are set, the etching process begin in operation 320. The etching operation 320 can include etching the substrate using a combination of etch stop layers and etching steps. The etching operation can also use varied clamp pressures and/or varied substrate temperatures to produce the desired shape in the silicon. While the etching is being done in operation 320, a decision is made in operation 325 whether it is time to change the etch conditions. The decision is made by either checking if a first time period has lapsed or by using detectors such as an end-point detector. If the decision in operation 325 is that it is not time to change the etch conditions, then etching continues in operation 320. If the decision in operation 325 is that it is time to change etch conditions (e.g. a first time period has lapsed) to make the pattern 215 at the bottom of the trench, then in operation 330 a second set of etch conditions is set. Setting the second etch conditions can include setting any one or combinations of gas mixture, gas pressure, gas flow, temperature, and bias power. Therefore, operation 330 sets a second gas mixture ratio, a second pressure, a second gas flow, a second temperature, and/or second bias power. The second gas mixture can include mixtures of $SF_6$, $O_2$, and any neutral diluting material such as helium, argon, xenon or other noble gasses or inert gasses. In one embodiment, the second ratio of $SF_6$ to $O_2$ is 1.1:1, the second pressure is 65 milliTorr, the second gas flow is 313 SCCM, the second bias power is 15 Watts, and the second temperature is set at 7° C. but can range from 2° C. to 12° C. In another embodiment, the second ratio of $SF_6$ to $O_2$ is 1.1:1, the second pressure is 55 milliTorr, the second gas flow is 313 SCCM, the second bias power is 15 Watts, and the second temperature is set at 7° C. but can range from 2° C. to 12° C. In another embodiment, the second ratio of $SF_6$ to $O_2$ is 1.3 1, the second pressure is 55 milliTorr the second gas flow is 330 SCCM, the second bias power is 15 Watts, and the second temperature is set at 7° C. but can range from 2° C. to 12° C.

In some embodiments the etching process is continuous so that the silicon substrate is being etched as the etch conditions are changed from the first set of etch conditions to the second set of etch conditions. For example, the second set of etch conditions can be set by reducing on the fly the amount of $O_2$, reducing the pressure to increase ion bombardment at the trench bottom to make the critical dimension (CD) wider and then increasing $O_2$ and raising pressure to increase polymer formation and narrowing the trench bottom, which forms small notches. In one embodiment, setting the second set of etch conditions can include decreasing the ratio of reactive gas to passivant gas so that the second ratio of reactive gas to passivant gas is less than the first ratio of reactive gas to passivant gas. In another embodiment, setting the second set of etch conditions can include changing the flow of the gas mixture so that the flow of the second gas mixture is different than the flow of the first gas mixture. In another embodiment, setting the second set of etch conditions can include decreasing the flow of the gas mixture so that the flow of the second gas mixture is less than the flow of the first gas mixture. In another embodiment, setting the second set of etch conditions can include changing the pressure of the gas mixture so that the pressure of the second gas mixture is different than the pressure of the first gas mixture. In another embodiment, setting the second set of etch conditions can include increasing the pressure of the gas mixture so that the pressure of the second gas mixture is higher than the pressure of the first gas mixture. In another embodiment, forming the first trench with the pattern further includes etching the substrate with a process that modulates an etchant process time to passivant process time and/or modulates an etchant gas composition to passivant gas composition. In another embodiment, the flow of neutral gas is changed. The flow of neutral gas, which can be an inert gas such as argon, helium, xenon, etc, can be changed either by itself or in combination with changes made to the gas mixture.

In other embodiments, which are not continuous, silicon is etched, using TDM, etching with varied pressure/etch/passivation step times to create a pattern similar to the one shown as a notch in pattern 215. The pattern or notch can be made by having longer etching steps and shorter passivant steps to increase the CDs at the trench bottom over a short depth in TDM processing.

As the first etch conditions are changed to the second etch conditions, the etching process continues in operation 335 to form the etch pattern 215 at the bottom of the trench. The etching process in operation 335 is set to run for a second time period which can range between 15 seconds and 25 seconds and is about 20 seconds in one embodiment. While the etching continues in operation 335, another decision is made in operation 340 whether the trench with pattern 215 is completed and whether it is time stop the etching process. The decision is made by checking if the second time period has lapsed. If the decision in operation 340 is that it is not time to stop the etching process, then etching continues in operation 335. If the decision in operation 340 is that it is time to stop the etching process (e.g. the second time period has lapsed), then in operation 345 the etching process stops. Next in operation 350, an oxide layer is formed on the first sidewalls 210 and pattern 215 of the first trench that leaves a second trench 240 located within the first trench and is separated from the first trench by the oxide layer 235. The second trench 240 has second sidewalls that are substantially vertical without showing the pattern 215 and a second bottom that is substantially flat. After the oxidation process, the internal profile of the second trench consists of a nominally flat bottom with nearly vertical sides without a re-entrant side-wall. The pattern compensates for the difference in oxidation rates between the bottom of the first trench and the first sidewalls.

Next in operation 355 after oxidation, the second trench 240 is filled with a conductive material to form a trench capacitor or LFCC-type device. The filling can be performed without a seam using un-doped, or lightly doped, polysilicon. In some embodiments this filling process is done with chemical vapor deposition (CVD), physical vapor deposition (PVD) or other techniques. The process ends in operation 360 when the floating capacitor device is sent on for further processing.

Figure 4A:
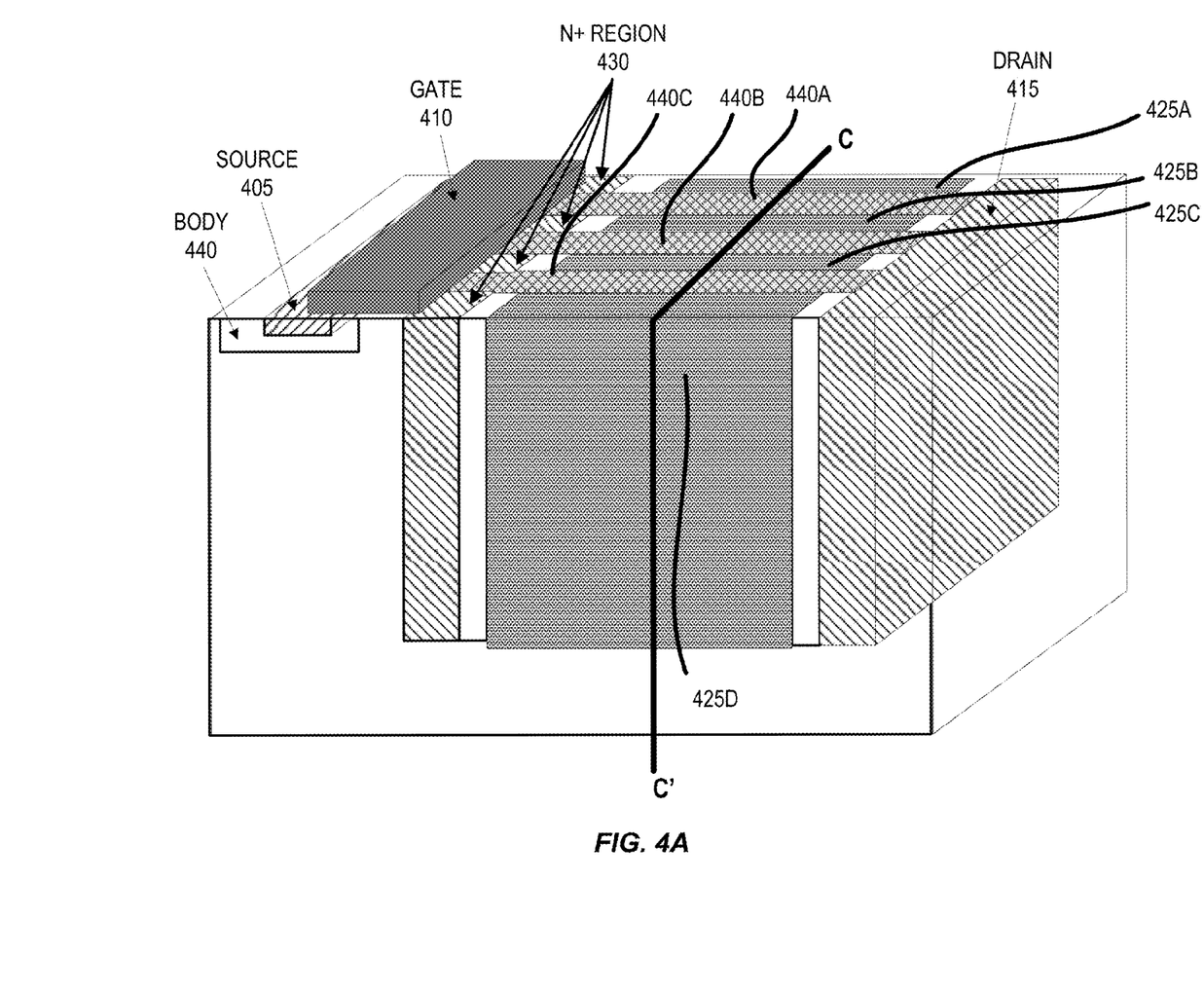
FIG. 4A is an illustration of a semiconductor device with pn junctions in the drift layers that can incorporate an embodiment.
Figure 4B:
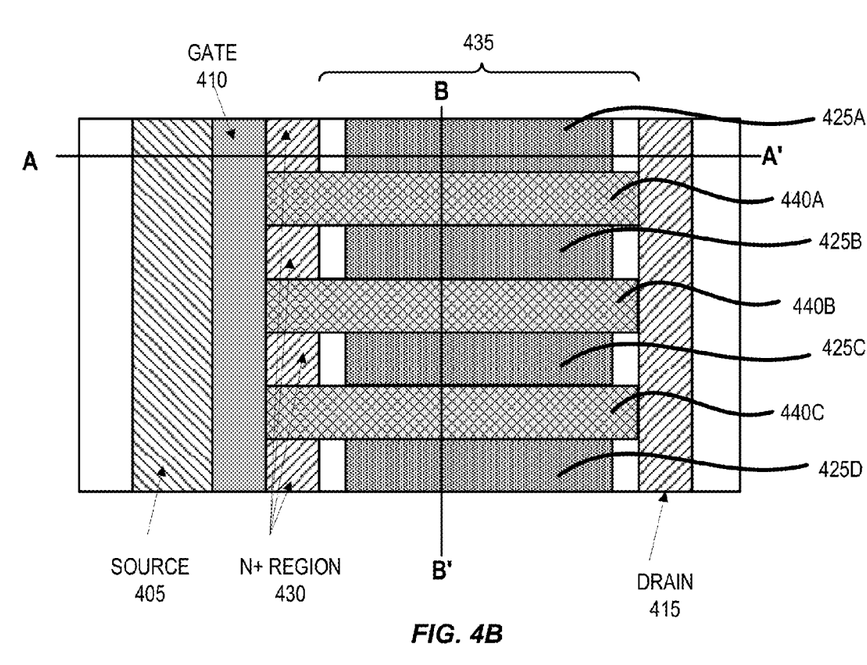
FIG. 4B is the top view of the semiconductor device of FIG. 4A.
Figure 4C:
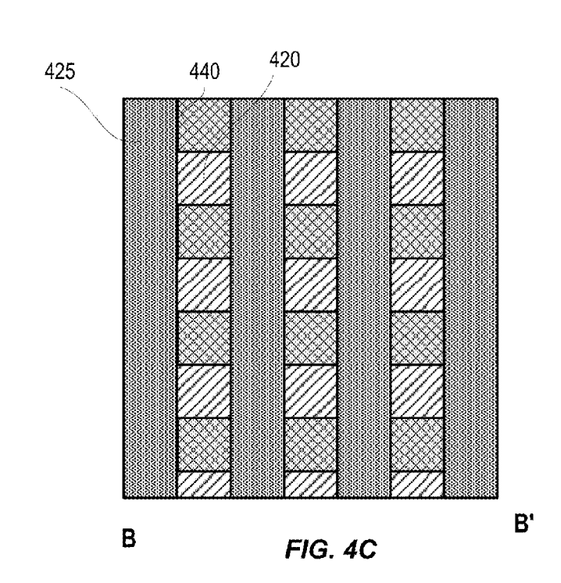
FIG. 4C is a cross sectional view of the semiconductor device of FIG. 4A along the cutline B-B' illustrated in FIG. 4B.

FIG. 4A is an illustration of a field effect transistor (FET) having floating coupled capacitor (FCC) regions, formed according to the method described above with reference to FIG. 3, and pn junctions in the active drift region. The FET includes a source 405, a gate 410, a drain 415, active drift regions (not shown), inactive vertical FCC regions (four shown) 425A-425D, P-resurf regions (three shown) 440A-440C, and interrupted N+ buffer region 430 and a body 440. FIG. 4B is a top view of FIG. 4A. FIG. 4C is a cross sectional view of FIGS. 4A and 4B along the cut line B-B' shown in FIG. 4B. FIG. 4C includes active drift regions 420, inactive vertical FCC regions 425, and P-resurf layers 440A-440C. The active drift regions 420 and the P-resurf layers 440A-440C create a pn junction. The active drift regions 420 have a structure that include alternating pn junctions which are in vertically stacked as explained with reference to FIG. 4D. The interrupted N+ buffer region 430 has segments aligning with the inactive vertical FCC regions 425A-425D. The P-resurf regions 440A-440C extend to the gate 410. In one embodiment, the P-resurf regions 440A-440C can be electrically connected to a ground through a connection to a P-body 440, and then to the substrate in a low-side LDMOS. This connection establishes an electrode-substrate coupling in an FCC trench. The N+ buffer region 430 is made of conductive material that makes electrical contact between the active drift regions and a channel formed under the gate 410. The source 405 is disposed in the body 440, which is a conductor. When sufficient voltage is applied to the gate 410 a channel forms under the gate 410 and current flows from the source 405 through the channel to the N+ buffer region 430 to the active drift regions and to the drain 415.

The FET illustrated in FIG. 4A can be formed by disposing one or more vertical pn junctions on portions of the drift regions that are between the inactive vertical FCC regions 425A-425D. This vertically stacked alternating P-N layer structure can be epitaxially grown before the FCC trench is etched. The inactive vertical FCC regions (four shown) 425A-425D can be formed according to the method described above with reference to FIG. 3. This method includes etching a silicon substrate to form a trench with a pattern 215 at the bottom, oxidizing the trench to form an oxidation layer 235 and a second trench 240, and then filling the second trench 240 with a conductive material. The same procedure can be used to form a number of isolated floating electrodes in the FCC trench after multi p-n epitaxial layers are deposited. The addition of pn junctions to the active drift region can increase the carrier concentration in the active drift region by about a factor of two, thereby substantially reducing the on-resistance of the device. In one example, if a box-like doping profile is used, then incorporation of P-resurf layers can increase n-drift concentration from $1 \times 10^{16}/cm^3$ to $2 \times 10^{16}/cm^3$ while maintaining breakdown voltage.

Figure 4D:
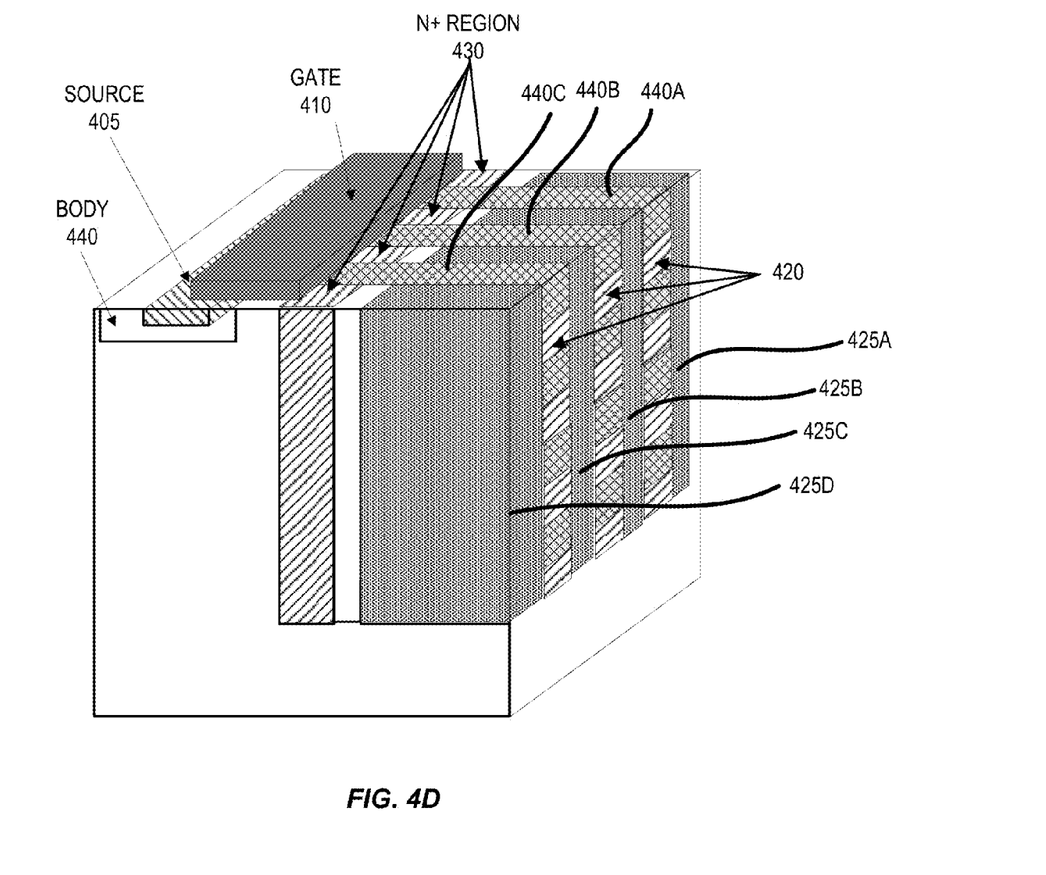
FIG. 4D is an illustration of a semiconductor device similar to FIG. 4A along the plane C-C' illustrated in FIG. 4A

FIG. 4D is a cross sectional illustration of the semiconductor device shown in FIG. 4A along the plane C-C'. The semiconductor device of FIG. 4A includes pn junctions in the active drift regions, vertical inactive FCC regions 425A-425D located on each side of an active drift regions 445. The active drift regions 445 includes a stack of pn junctions which can increase the carrier concentration in the active drift region by about a factor of two, thereby substantially reducing the on-resistance of the device. The thickness of the individual p and individual n layers can vary depending on the dosage.

In addition to the cell structure shown in FIGS. 4A-4D, the trench process described herein can be use in forming the cell structures and semiconductor devices as described in co-pending U.S. application Ser. No. 12/424,004, filed Apr. 17, 2009, and co-pending U.S. application Ser. No. 11/801,819, filed May 10, 2007, both of which are incorporated herein by reference in their entirety. For example, the trench processes described herein can be used to form the cell structure illustrated in FIGS. 1A-3B of co-pending U.S. application Ser. No. 12/424,004 and in FIGS. 1-3 of co-pending U.S. application Ser. No. 11/801,819.

The trench process described herein is also applicable to semiconductor device in general which include a source, a drain, a gate, and trench structures. Generally, in these semiconductor devices at least one of the trench structures includes a first trench that extends vertically from an upper surface to a depth within a silicon substrate. The first trench has first sidewalls, a first bottom, and a pattern formed on the first sidewalls near the first bottom of the trench. An oxide layer is disposed on the first sidewalls and first bottom of the first trench that leaves a second trench located within the first trench and is separated from the first trench by the oxide layer. The second trench has second sidewalls that are substantially vertical without showing the pattern and a second bottom that is substantially flat. The pattern compensates for the difference in oxidation rates between the bottom of the first trench and the first sidewalls. The at least one trench structure of the semiconductor device can further include a conductive material disposed within the second trench to form a floating coupled capacitor. The first trench of the semiconductor device can include a (111) silicon crystallographic plane along the first bottom surface of the first trench, a (110) silicon crystallographic plane along the first side wall surface of the first trench, and at least one silicon crystallographic plane along the pattern surface that compensates for the difference in oxidation rates between the (111) silicon crystallographic plane and the (110) silicon crystallographic plane. The pattern in the trench of the semiconductor device can be a notch shape.

Although specific embodiments of the invention have been described, various modifications, alterations, alternative constructions, and equivalents are also encompassed within the scope of the invention. The described invention is not restricted to operation within certain specific embodiments, but is free to operate within other embodiments configurations as it should be apparent to those skilled in the art that the scope of the present invention is not limited to the described series of transactions and steps.

The specification and drawings are, accordingly, to be regarded in an illustrative rather than a restrictive sense. It will, however, be evident that additions, subtractions, deletions, and other modifications and changes may be made thereunto without departing from the broader spirit and scope of the invention as set forth in the claims.

What is claimed is:

1. A semiconductor device comprising:
   a trench region disposed within a silicon substrate, the trench region including:
     an outer trench having an outer trench sidewall defining an upper portion and a bottom portion of the outer trench, the upper portion of the outer trench having a first width that is substantially constant, the outer trench sidewall including a pattern in the bottom portion of the outer trench, the pattern including:
       a first portion that decreases in width from the first width to a second width;
       a second portion of substantially the second width;
       a third portion that increases in width from the second width to a third width;
       a fourth portion that decreases in width from the third width to a fourth width; and
       an outer trench bottom surface that is substantially flat;
     an oxide layer disposed on the sidewall of the outer trench and the bottom portion of the outer trench such that the oxide layer forms an inner trench within the outer trench, the inner trench having an inner trench sidewall that is substantially vertical and an inner trench bottom surface that is substantially flat; and
     a floating coupled capacitor including a conductive material disposed within the inner trench.

2. The semiconductor device of claim 1, further comprising an active drift region that includes a plurality of alternating PN junctions.

3. The semiconductor device of claim 1, further comprising:
   an active drift region of a first conductivity type; and
   a plurality of reduced surface field (resurf) layers of a second conductivity type,
   the active drift region and the plurality of resurf layers being disposed such that they form a plurality of alternating PN junctions.

4. The semiconductor device of claim 1, further comprising:
   a source region; and
   a drain region,
   the floating coupled capacitor being disposed between the source region and the drain region.

5. The semiconductor device of claim 1, wherein the conductive material is disposed within the inner trench such that no void is formed.

6. The semiconductor device of claim 1, further comprising a reduced surface field (resurf) layer of a first conductivity type that is electrically connected to the silicon substrate, such that an electrode-substrate electrical coupling is established in the floating coupled capacitor.

7. The semiconductor device of claim 1, wherein the outer trench includes:
   a (111) silicon crystallographic plane along the outer trench bottom surface;
   a (110) silicon crystallographic plane along a surface of the outer trench sidewall in the upper portion of the outer trench; and
   at least one silicon crystallographic plane along a surface of the pattern that compensates for a difference in oxidation rates between the (111) silicon crystallographic plane and the (110) silicon crystallographic plane.

8. A semiconductor device comprising:
   an outer trench including:
     a bottom portion of the outer trench including a pattern; and
     a sidewall of the outer trench in an upper portion of the outer trench, the sidewall of the outer trench being substantially vertical, the upper portion of the outer trench having a first width that is substantially constant; and
   an oxide layer disposed on the sidewall of the outer trench and disposed on the bottom portion of the outer trench such that the oxide layer forms an inner trench within the outer trench, the inner trench having a sidewall of the inner trench that is substantially vertical,
   the pattern of the outer trench being configured to compensate for a difference in oxidation rates between the bottom portion of the outer trench and the sidewall of the outer trench, the pattern including:
a first portion that decreases in width from the first width to a second width;
a second portion of substantially the second width;
a third portion that increases in width from the second width to a third width; and
a fourth portion that decreases in width.

9. The semiconductor device of claim 8, further comprising a conductive material disposed within the inner trench to form a floating coupled capacitor.

10. The semiconductor device of claim 8, wherein the outer trench comprises:
a (111) silicon crystallographic plane along a bottom surface of the outer trench;
a (110) silicon crystallographic plane along a surface of the sidewall of the outer trench; and
at least one silicon crystallographic plane along a surface of the pattern that compensates for the difference in oxidation rates, the difference in oxidation rates being between an oxidation rate of the (111) silicon crystallographic plane and an oxidation rate of the (110) silicon crystallographic plane.

11. The semiconductor device of claim 8, further comprising an active drift region that includes a plurality of alternating PN junctions.

12. The semiconductor device of claim 8, further comprising:
an active drift region of a first conductivity type; and
a plurality of reduced surface field (resurf) layers of a second conductivity type,
the active drift region and the plurality of resurf layers being arranged such that they form a plurality of alternating PN junctions.

13. The semiconductor device of claim 8, further comprising an active drift region including a plurality of vertically stacked PN junctions, the active drift region being divided horizontally by the outer trench.

14. The semiconductor device of claim 9, wherein the conductive material is disposed within the inner trench such that no void is formed.

15. The semiconductor of claim 9, further comprising a reduced surface field (resurf) layer of a first conductivity type that is electrically connected to a substrate, such that an electrode-substrate electrical coupling is established in the floating coupled capacitor.

16. A transistor comprising:
an active drift region configured to, when in an on state, conduct electricity between a source region and a drain region; and
a conductive material disposed within an inner trench,
the inner trench including an inner trench sidewall that is substantially vertical, and
the inner trench being separated from an outer trench by an oxide layer, the outer trench having a pattern in a bottom portion of the outer trench and an outer trench sidewall in an upper portion of the outer trench, the upper portion of the outer trench having a substantially constant first width, the pattern including:
a first portion that decreases in width from the first width to a second width;
a second portion of substantially the second width;
a third portion that increases in width from the second width to a third width; and
a fourth portion that decreases in width.

17. The transistor of claim 16, further comprising:
a plurality of alternating PN junctions disposed in the active region; and
an inactive floating coupled capacitor that includes the conductive material disposed within the inner trench.

18. The transistor of claim 16, wherein the outer trench includes:
a (111) silicon crystallographic plane along a bottom surface of the outer trench;
a (110) silicon crystallographic plane along a surface of the outer trench sidewall; and
at least one silicon crystallographic plane along a surface of the pattern that compensates for a difference in oxidation rates between the (111) silicon crystallographic plane and the (110) silicon crystallographic plane.

* * * * *